United States Patent
Liu et al.

(10) Patent No.: US 11,251,781 B2
(45) Date of Patent: Feb. 15, 2022

(54) DYNAMIC D FLIP-FLOP, DATA OPERATION UNIT, CHIP, HASH BOARD AND COMPUTING DEVICE

(71) Applicant: CANAAN CREATIVE CO., LTD., Beijing (CN)

(72) Inventors: Jieyao Liu, Beijing (CN); Nangeng Zhang, Beijing (CN); Jingjie Wu, Beijing (CN); Shenghou Ma, Beijing (CN)

(73) Assignee: CANAAN CREATIVE CO., LTD., Beijing (CN)

( * ) Notice: Subject to any disclaimer, the term of this patent is extended or adjusted under 35 U.S.C. 154(b) by 0 days.

(21) Appl. No.: 17/045,276

(22) PCT Filed: May 7, 2019

(86) PCT No.: PCT/CN2019/085893
§ 371 (c)(1),
(2) Date: Oct. 5, 2020

(87) PCT Pub. No.: WO2020/001167
PCT Pub. Date: Jan. 2, 2020

(65) Prior Publication Data
US 2021/0167761 A1      Jun. 3, 2021

(30) Foreign Application Priority Data

Jun. 25, 2018   (CN) .......................... 201810667038.2
Jun. 25, 2018   (CN) .......................... 201810667040.X
(Continued)

(51) Int. Cl.
*H03K 3/356*    (2006.01)
*H03K 3/35*     (2006.01)
(Continued)

(52) U.S. Cl.
CPC .......... *H03K 3/356026* (2013.01); *H03K 3/35* (2013.01); *H03K 3/86* (2013.01); *H03K 19/0016* (2013.01)

(58) Field of Classification Search
CPC ........ G11C 19/00; G11C 19/28; H03K 19/00; H03K 19/0016; H03K 19/21; H03K 3/00;
(Continued)

(56) References Cited

U.S. PATENT DOCUMENTS 6,198,324 B1 *   3/2001  Schober .............. H01L 27/0207
                                                           327/202
10,381,758 B1 *  8/2019  Scanlon .............. G06Q 20/065
(Continued)

FOREIGN PATENT DOCUMENTS

CN          101079614 A      11/2007
CN          104270151 A       1/2015
(Continued)

OTHER PUBLICATIONS

International Search Report dated Aug. 7, 2019 in related International Application No. PCT/CN2019/085893.

*Primary Examiner* — Lincoln D Donovan
*Assistant Examiner* — Dave Mattison
(74) *Attorney, Agent, or Firm* — Maschoff Brennan

(57) ABSTRACT

The invention provides a dynamic D flip-flop, and a data operation unit, a chip, a hash board and a computing device using the same. The dynamic D flip-flop comprises: an input terminal, an output terminal and at least one clock signal terminal; a first latch unit for transmitting data of the input terminal and latching the data under control of a clock signal; a second latch unit for latching data of the output terminal and inversely transmitting the data latched by the first latch unit under control of a clock signal; and an output driving unit for inverting and outputting the data received
(Continued)

from the second latch unit; wherein the second latch unit outputs in high level, low level and high impedance states by means of a single element under control of a clock signal. Therefore, the invention can effectively reduce chip area, power consumption, and logic delay.

16 Claims, 10 Drawing Sheets

(30) Foreign Application Priority Data

Jun. 25, 2018 (CN) .......................... 201810667264.0
Jun. 25, 2018 (CN) .......................... 201810667321.5
Jun. 25, 2018 (CN) .......................... 201810667322.X

(51) Int. Cl.
*H03K 3/86* (2006.01)
*H03K 19/00* (2006.01)

(58) Field of Classification Search
CPC ........ H03K 3/012; H03K 3/013; H03K 3/037; H03K 3/0375; H03K 3/35; H03K 3/356017; H03K 3/356026; H03K 3/35606; H03K 3/286; H03K 3/86; H04B 1/00; H04B 1/04; H04L 25/00; H04L 25/029

USPC .................................................. 327/212, 225
See application file for complete search history.

(56) References Cited

U.S. PATENT DOCUMENTS

| 2010/0156494 | A1 | 6/2010 | Turner et al. | |
| 2017/0201240 | A1* | 7/2017 | Xue | H03K 3/012 |
| 2018/0019736 | A1* | 1/2018 | Kim | H03K 3/356104 |
| 2019/0310691 | A1* | 10/2019 | Ahn | H05K 7/20309 |

FOREIGN PATENT DOCUMENTS

| CN | 104333351 A | 2/2015 |
| CN | 107222187 A | 9/2017 |
| CN | 208608967 U | 3/2019 |
| CN | 208608968 U | 3/2019 |
| CN | 208608969 U | 3/2019 |
| CN | 208608970 U | 3/2019 |
| CN | 208861273 U | 5/2019 |

* cited by examiner

DYNAMIC D FLIP-FLOP, DATA OPERATION UNIT, CHIP, HASH BOARD AND COMPUTING DEVICE

BACKGROUND OF THE INVENTION

1. Field of the Invention

The invention relates to a storage device controlled by a clock, and particularly to a dynamic D flip-flop, and a data operation unit, a chip, a hash board and a computing device using the same.

2. Related Art

Virtual currency (e.g., BTC, ETH) is a digital currency in the form of P2P, and since launching of BTC system in 2009, the virtual currency has attracted widespread attention. The system constructs a distributed shared general ledger based on a block chain, thereby ensuring safety, reliability and decentration of system operation.

In terms of hash operation and proof of work, BTC is an only correct hash obtained by computation to prove the proof of work, thereby obtaining bookkeeping package block weight, so an award is acquired, and this is the proof of work (Pow).

Currently, except brute-force computation, no effective algorithm is still available for hash operation. Mining BTC starts from low cost hardware of CPU or GPU, but with population of BTC, the process of mining has a great change. Now, mining activities are transferred to field-programmable gate array (FPGA) or application specific integrated circuit (ASIC), and mining efficiency of such FPGA or ASIC mining mode is extremely high.

The D flip-flops have a very extensive application, and can be applied for registers, shift registers, frequency division and waveform generators of digital signals. The D flip-flop has two inputs of data (Data) and clock (CLK), and one output (Q), and data can be written into or read from the D flip-flop.

CN1883116A discloses a positive feed-back D flip-flop circuit 106 shown in FIG. 1, and the positive feed-back D flip-flop circuit 106 includes an analog switch 300, an inverter 302, an analog switch 304, an inverter 306, an inverter 308, an analog switch 310, an inverter 312, and an analog switch 314. The analog switches 300, 304, 310 and 314 are analog switches using P-path/N-path transistors and perform switching operation by CKP whose phase is the same as CK and CKN whose phase is inverse to it. The inverters 302, 306, 308 and 312 are CMOS inverters. As can be seen, a traditional D flip-flop needs substantially sixteen PMOS/NMOS transistors, which occupy a large area.

As for a new generation computing device for mining virtual digital currency, the process of mining is a production line for performing a large amount of repetitive logic computation, so several D flip-flops are required for storing data. Therefore, in the computing device with a large number of D flip-flops, disadvantages of an increased chip area, a slow operation speed, and difficulty in controlling electric leakage exist.

CN1883116A further discloses a dynamic D flip-flop circuit 102 shown in FIG. 2, and the dynamic D flip-flop circuit 102 includes a first analog switch 200, a first inverter 202, a second analog switch 204, and a second inverter 206. The dynamic D flip-flop circuit 102 configures a sample-and-hold circuit by the analog switches of the first and second analog switches 200 and 204, and the parasitic capacitance such as the gate capacitance and the wiring capacitance of the first and second inverters 202 and 206.

In the dynamic D flip-flop, the inverter 202 and the analog switch 204 are separately configured, and have problems of difficulty in controlling the analog switch, and a slow access speed.

SUMMARY OF THE INVENTION

To solve the above problems, the invention provides a dynamic D flip-flop for a computing device, which can effectively reduce chip area, power consumption, and logic delay.

To realize the object, the invention provides a dynamic D flip-flop, comprising:

an input terminal, an output terminal and at least one clock signal terminal;

a first latch unit for transmitting data of the input terminal and latching the data under control of a clock signal;

a second latch unit for latching data of the output terminal and inversely transmitting the data latched by the first latch unit under control of a clock signal; and an output driving unit for inverting and outputting the data received from the second latch unit;

the first latch unit, the second latch unit and the output driving unit being sequentially connected in series between the input terminal and the output terminal;

wherein the second latch unit outputs in high level, low level and high impedance states by means of a single element under control of a clock signal.

In the dynamic D flip-flop, the second latch unit is a three-state inverter.

In the dynamic D flip-flop, the three-state inverter further comprises a first PMOS transistor, a second PMOS transistor, a first NMOS transistor and a second NMOS transistor sequentially connected in series between a power supply and ground.

In the dynamic D flip-flop, the first PMOS transistor and the second NMOS transistor perform switch control according to a clock signal, and the clock signals of the first PMOS transistor and the second NMOS transistor are inverted.

In the dynamic D flip-flop, the second PMOS transistor and the first NMOS transistor perform switch control according to a clock signal, and the clock signals of the second PMOS transistor and the first NMOS transistor are inverted.

In the dynamic D flip-flop, the second latch unit uses low leakage devices and/or the output driving unit uses high threshold voltage devices.

In the dynamic D flip-flop, the first NMOS transistor and the second NMOS transistor use low leakage current transistors.

In the dynamic D flip-flop, the dynamic D flip-flop further comprises a positive feedback unit for inverting data of the output terminal and feeding the data to the output driving unit.

In the dynamic D flip-flop, the positive feedback unit is an inverter connected in parallel to both ends of the output driving unit.

In the dynamic D flip-flop, the first latch unit uses a delay unit.

In the dynamic D flip-flop, the clock signal terminal is connected with a clock buffer using low threshold units.

In the dynamic D flip-flop, a plurality of dynamic D flip-flops are connected in parallel.

Application of the dynamic D flip-flop of the invention can reduce approximately 30% of the chip area, thereby reducing production cost of the chip, and increasing product competitiveness. In terms of expanding, such dynamic D flip-flop can replace a D flip-flop in digital logic to simplify wiring process of the back-end layout, reduce design difficulty, and improve performance, thereby obtaining an advantage of area, and increasing practicability.

To better realize the object, the invention further provides a data operation unit, comprising a control circuit, an operational circuit and a plurality of dynamic D flip-flops interconnected with each other, the plurality of dynamic D flip-flops being connected in series and/or in parallel, wherein the plurality of dynamic D flip-flops are any one of the dynamic D flip-flops.

To better realize the object, the invention further provides a chip, comprising any one of the data operation units.

To better realize the object, the invention further provides a hash board for a computing device, comprising any one of the chips.

To better realize the object, the invention further provides a computing device, comprising a power supply board, a control board, a connection board, a radiator and a plurality of hash boards, the control board connected to the hash boards through the connection board, the radiator provided around the hash boards, and the power supply board configured to supply a power supply for the connection board, the control board, the radiator and the hash boards, wherein the hash board is any one of the hash boards.

Application of the computing device of the invention can better save the chip area, reduce production cost, and further reduce power consumption of the computing device.

Hereinafter the invention is described in details with reference to the accompanying drawings and the detailed embodiments, but the invention is not limited thereto.

Specific terms are used in the specification and the subsequent claims to refer to specific components. Those skilled in the art shall understand that the manufacturer may give a different name to the same component. The specification and the subsequent claims distinguish components from each other by different functions of the components, instead of different names.

"Comprise" and "include" mentioned in the whole specification and the subsequent claims are open words, and shall be explained as "include but is not limited to". In addition, "connection" herein includes any direct or indirect electrical connection means. Indirect electrical connection means comprises connection through other devices.

PREFERABLE EMBODIMENTS OF THE INVENTION

Hereinafter structure principle and working principle of the invention are described in detail with reference to the accompanying drawings.

Figure 1:
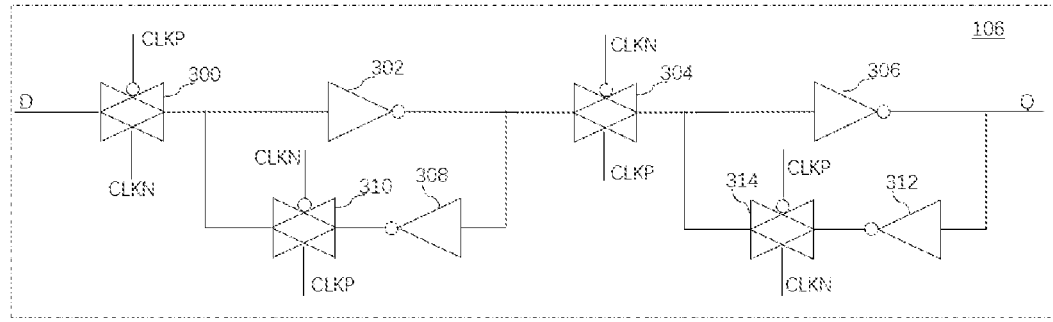
FIG. 1 is a schematic diagram of a positive feedback D flip-flop in the prior art.
Figure 2:
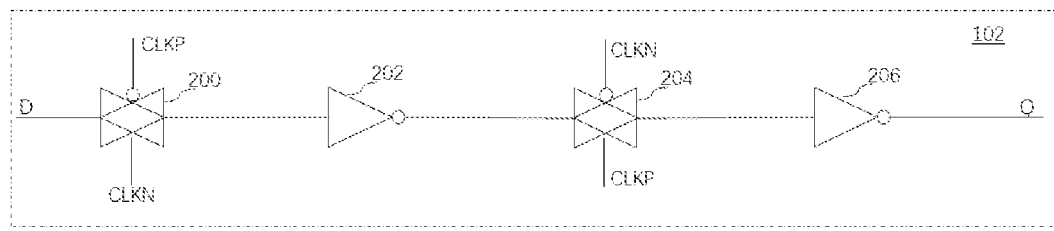
FIG. 2 is a schematic diagram of a dynamic D flip-flop in the prior art.
Figure 3:
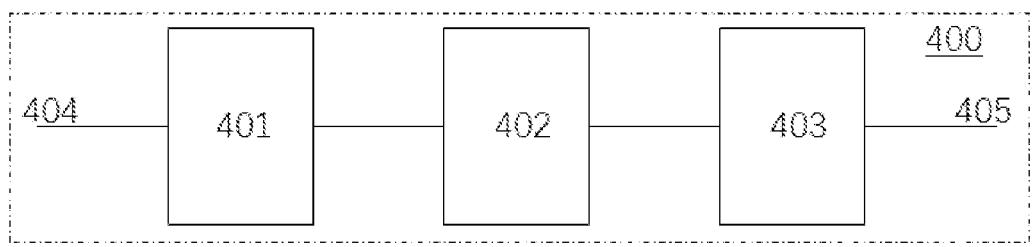
FIG. 3 is a schematic diagram of a dynamic D flip-flop according to the invention.

FIG. 3 is a schematic diagram of a dynamic D flip-flop according to the invention. Referring to FIG. 3, the dynamic D flip-flop 400 is formed of a first latch unit 401, a second latch unit 402 and an output driving unit 403. The first latch unit 401, the second latch unit 402 and the output driving unit 403 are sequentially connected in series between an input terminal 404 and an output terminal 405 of the dynamic D flip-flop 400.

Embodiment One

Figure 4A:
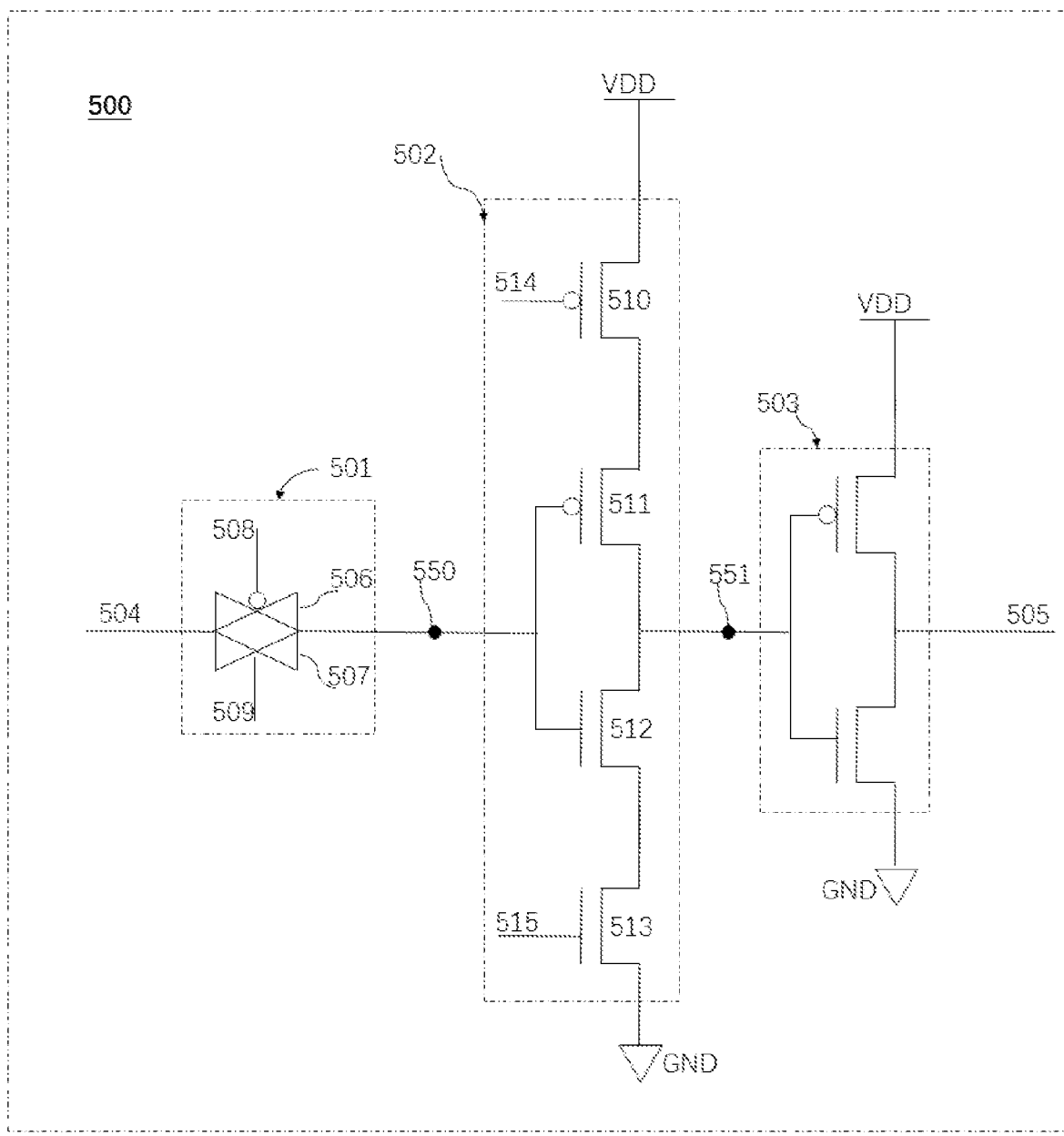
FIG. 4A is a circuit diagram of a dynamic D flip-flop in one embodiment of the invention.

FIG. 4A is a circuit diagram of a dynamic D flip-flop in one embodiment of the invention.

Referring to FIG. 3, as shown in FIG. 4A, a first latch unit 401 of the dynamic D flip-flop 500 is a transmission gate 501, and the transmission gate 501 forms an analog switch under control of clock signals using parallel connection of a PMOS transistor 506 and a NMOS transistor 507. One end of the transmission gate 501 is connected to an input terminal 504 of the dynamic D flip-flop 500, a gate terminal 508 of the PMOS transistor 506 is controlled by a clock signal CLKP, and a gate terminal 509 of the NMOS transistor 507 is controlled by a clock signal CLKN in opposite phase with CLKP. When CLKP is a high level, CLKN is a low level, the PMOS transistor 506 and the NMOS transistor 507 of the transmission gate 501 are turned off, the transmission gate 501 is closed, and data of the input terminal 504 cannot be transmitted to the other end of the transmission gate 501, such that data at a first node 550 of the other end of the transmission gate 501 are latched to hold an original state. When CLKP is a low level, CLKN is a high level, the PMOS transistor 506 and the NMOS transistor 507 of the transmission gate 501 are turned on, the transmission gate 501 is open, and data of the input terminal 504 can be transmitted to the other end of the transmission gate 501 through the transmission gate 501, such that data at the first node 550 are rewritten to the same data as that of the input terminal 504.

Referring to FIG. 3, as shown in FIG. 4A, a second latch unit 402 of the dynamic D flip-flop 500 is a three-state inverter 502, and the three-state inverter 502 comprises PMOS transistors 510, 511 and NMOS transistors 512, 513. The NMOS transistors 512, 513 are low leakage devices. Gate electrodes of the PMOS transistor 511 and the NMOS transistor 512 are connected together to form an input terminal of the three-state inverter 502. A source electrode of the PMOS transistor 510 is connected to a power supply VDD, and a source electrode of the NMOS transistor 513 is connected to ground GND. Drain electrodes of the PMOS transistor 511 and the NMOS transistor 512 are connected together to form an output terminal of the three-state inverter 502. A source electrode of the PMOS transistor 511 is connected to a drain electrode of the PMOS transistor 510, and a source electrode of the NMOS transistor 512 is connected to a drain electrode of the NMOS transistor 513.

A gate terminal 514 of the PMOS transistor 510 is controlled by the clock signal CLKN, and a gate terminal 515 of the NMOS transistor 513 is controlled by the clock signal CLKP as clock control terminals of the three-state inverter 502.

When CLKP is a low level, CLKN is a high level, the PMOS transistor 510 and the NMOS transistor 513 are both in a turn-off state, and the three-state inverter 502 is in a high impedance state, such that data at the first node 550 cannot pass through the three-state inverter 502, and data at a second node 551 are latched to hold the original state, thereby functioning as a data register.

When CLKP is a high level, CLKN is a low level, the PMOS transistor 510 and the NMOS transistor 513 are both in a turn-on state, the three-state inverter 502 functions to invert data of the input terminal, such that data at the first node 550 are inverted and outputted to the second node 551 to rewrite the data at the second node 551.

Referring to FIG. 3, as shown in FIG. 4A, an output driving unit 403 is an inverter 503 for inverting the data received from the three-state inverter 502 again, so as to form data in the same phase with the data of the input terminal 504 of the dynamic D flip-flop, and output the data through an output terminal 505. Meanwhile, the output driving unit 403 also can improve driving capability of data, and the inverter 503 uses high threshold voltage devices.

Embodiment Two

Figure 4B:
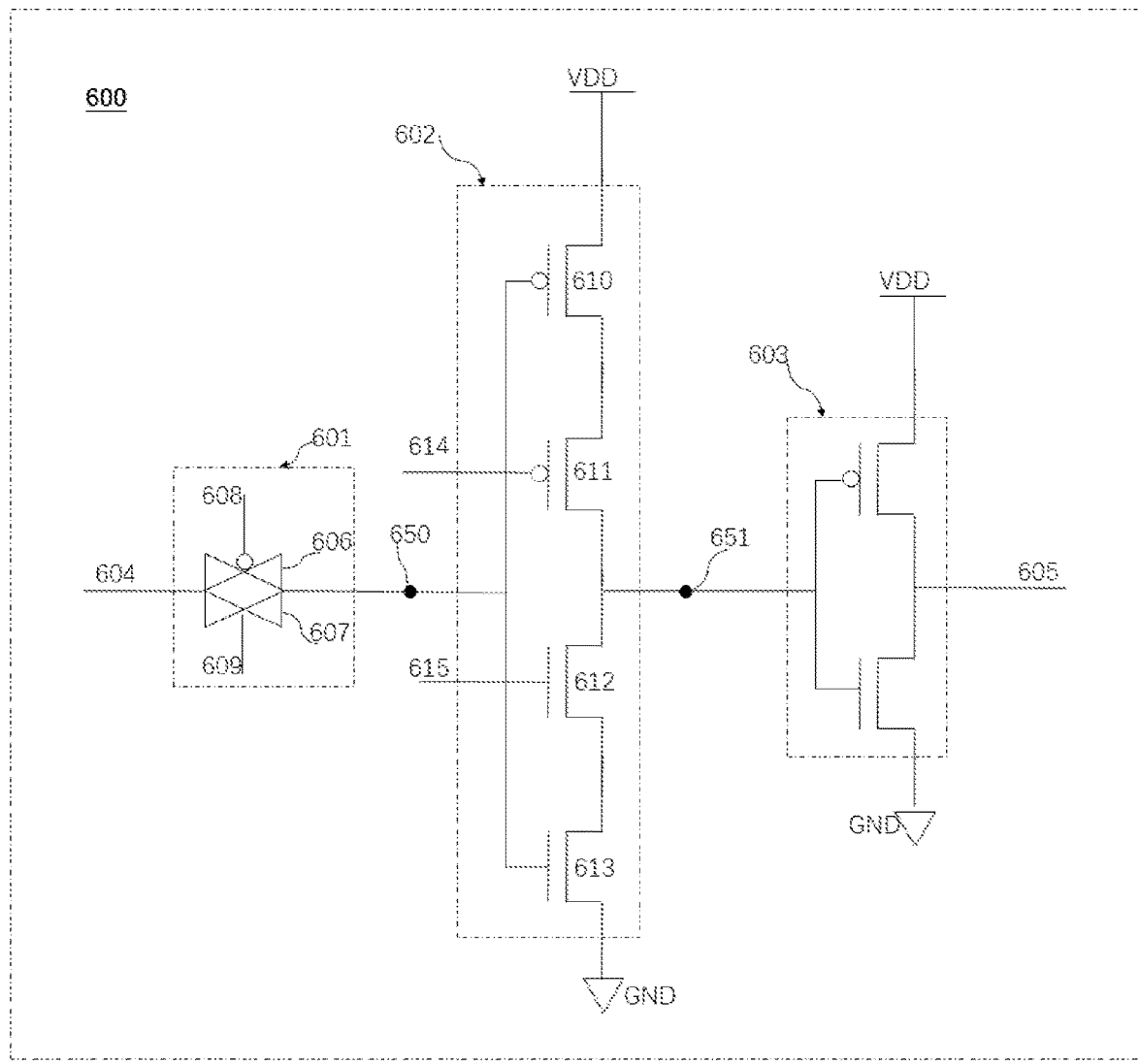
FIG. 4B is a circuit diagram of a dynamic D flip-flop in another embodiment of the invention.

Referring to FIG. 3, as shown in FIG. 4B, a first latch unit 401 of a dynamic D flip-flop 600 is a transmission gate 601, and the transmission gate 601 forms an analog switch under control of clock signals using parallel connection of a PMOS transistor 606 and a NMOS transistor 607. One end of the transmission gate 601 is connected to an input terminal 604 of the dynamic D flip-flop 600, a gate terminal 608 of the PMOS transistor 606 is controlled by a clock signal CLKP, and a gate terminal 609 of the NMOS transistor 607 is controlled by a clock signal CLKN in opposite phase with CLKP. When CLKP is a high level, CLKN is a low level, the PMOS transistor 606 and the NMOS transistor 607 of the transmission gate 601 are turned off, the transmission gate is closed, and data of the input terminal 604 cannot be transmitted to the other end of the transmission gate 601, such that data at a first node 650 are latched to hold an original state. When CLKP is a low level, CLKN is a high level, the PMOS transistor 606 and the NMOS transistor 607 of the transmission gate 601 are turned on, the transmission gate 601 is open, and data of the input terminal 604 are outputted to the other end through the transmission gate 601, such that data at the first node 650 are rewritten to the same data as that of the input terminal 604.

Referring to FIG. 3, as shown in FIG. 4B, a second latch unit 402 of the dynamic D flip-flop 600 is a three-state inverter 602, and the three-state inverter 602 comprises PMOS transistors 610, 611 and NMOS transistors 612, 613. The NMOS transistors 612, 613 are low leakage devices. Gate electrodes of the PMOS transistor 611 and the NMOS transistor 613 are connected together to form an input terminal of the three-state inverter 602. A source electrode of the PMOS transistor 610 is connected to a power supply VDD, and a source electrode of the NMOS transistor 613 is connected to ground GND. Drain electrodes of the PMOS transistor 611 and the NMOS transistor 612 are connected together to form an output terminal of the three-state inverter 602. A source electrode of the PMOS transistor 611 is connected to a drain electrode of the PMOS transistor 610, and a source electrode of the NMOS transistor 612 is connected to a drain electrode of the NMOS transistor 613.

A gate terminal 614 of the PMOS transistor 611 is controlled by the clock signal CLKN, and a gate terminal 615 of the NMOS transistor 612 is controlled by the clock signal CLKP as clock control terminals of the three-state inverter 602.

When CLKP is a low level, CLKN is a high level, the PMOS transistor 611 and the NMOS transistor 612 are both in a turn-off state, and the three-state inverter 602 is in a high impedance state, such that data at the first node 650 cannot pass through the three-state inverter 602, and data at a second node 651 are latched to hold the original state, thereby functioning as a data register.

When CLKP is a high level, CLKN is a low level, the PMOS transistor 611 and the NMOS transistor 612 are both in a turn-on state, the three-state inverter 602 functions to invert data of the input terminal, such that data at the first node 650 are inverted and outputted to the second node 651 to rewrite the data at the second node 651.

Referring to FIG. 3, as shown in FIG. 4B, an output driving unit 403 is an inverter 603 for inverting the data received from the three-state inverter 602 again, so as to form data in the same phase with the data of the input terminal 604 of the dynamic D flip-flop, and output the data through an output terminal 605. Meanwhile, the output driving unit 403 also can improve driving capability of data, and the inverter 603 uses high threshold voltage devices.

Variable Embodiment One

Figure 4C:
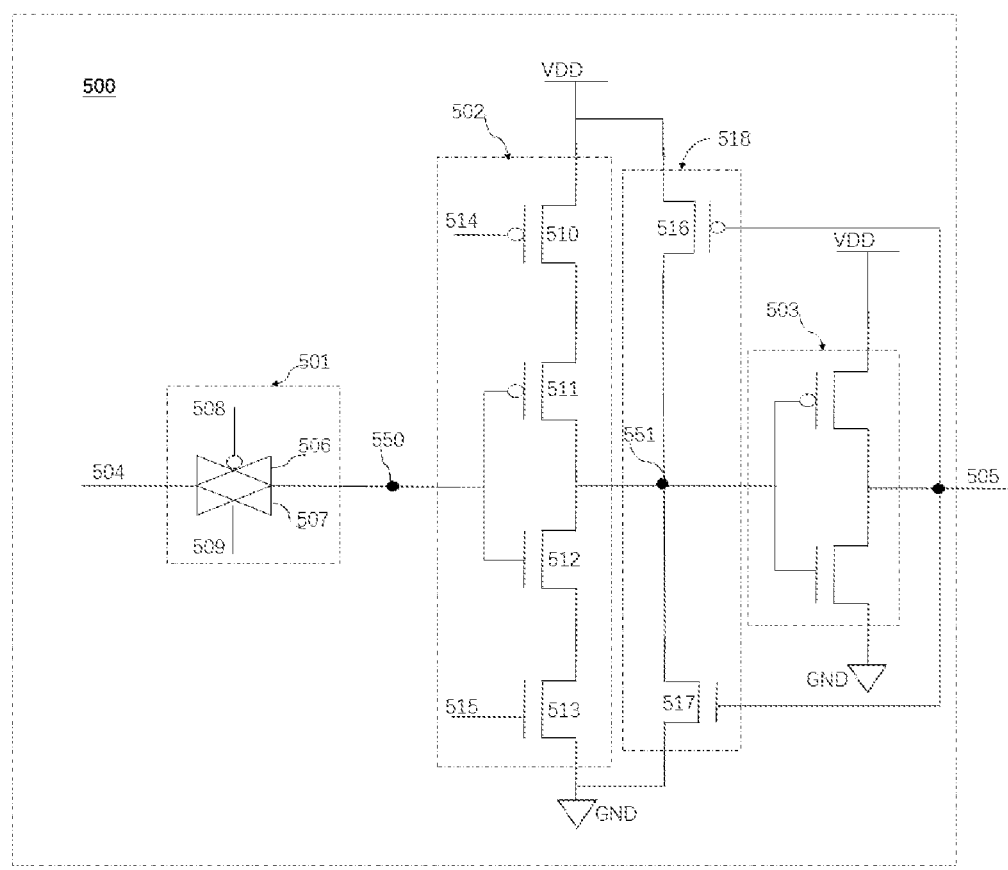
FIG. 4C is a circuit diagram of a variable embodiment of the dynamic D flip-flop of FIG. 4A.

FIG. 4C is a circuit diagram of a variable embodiment of the dynamic D flip-flop of FIG. 4A. Referring to FIG. 3, FIG. 4C differs from the embodiment of FIG. 4A in that the dynamic D flip-flop of FIG. 4C further comprises a positive feedback unit connected in parallel to both ends of the output driving unit 403. In this variable embodiment, the positive feedback unit is, such as, an inverter 518 consisting of a PMOS transistor 516 and a NMOS transistor 517, an input terminal of the inverter 518 is connected to an output terminal of the inverter 503, i.e., the output terminal 505 of the positive feedback dynamic D flip-flop 500, and an output terminal of the inverter 518 is connected to an input terminal of the inverter 503. When data at the second node 551 are "1", an output of the inverter 503 is "0", the PMOS transistor 516 is turned on to form a pull-up path to hold the data at the second node 551 to be "1". When the data at the second node 551 are "0", an output of the inverter 503 is "1", the NMOS transistor 517 is turned on to form a pull-down path to hold the data at the second node 551 to be "0". As can be seen, the inverters 518 and 503 form a data latch loop for better latching data of the output terminal 505 of the positive feedback dynamic D flip-flop at the second node 551. In addition, a feedback loop consisting of the PMOS transistor 516 and the NMOS transistor 517 shall have a worse current capacity than a normal reading and writing path, such that new data can be written correctly.

Variable Embodiment Two

Figure 4D:
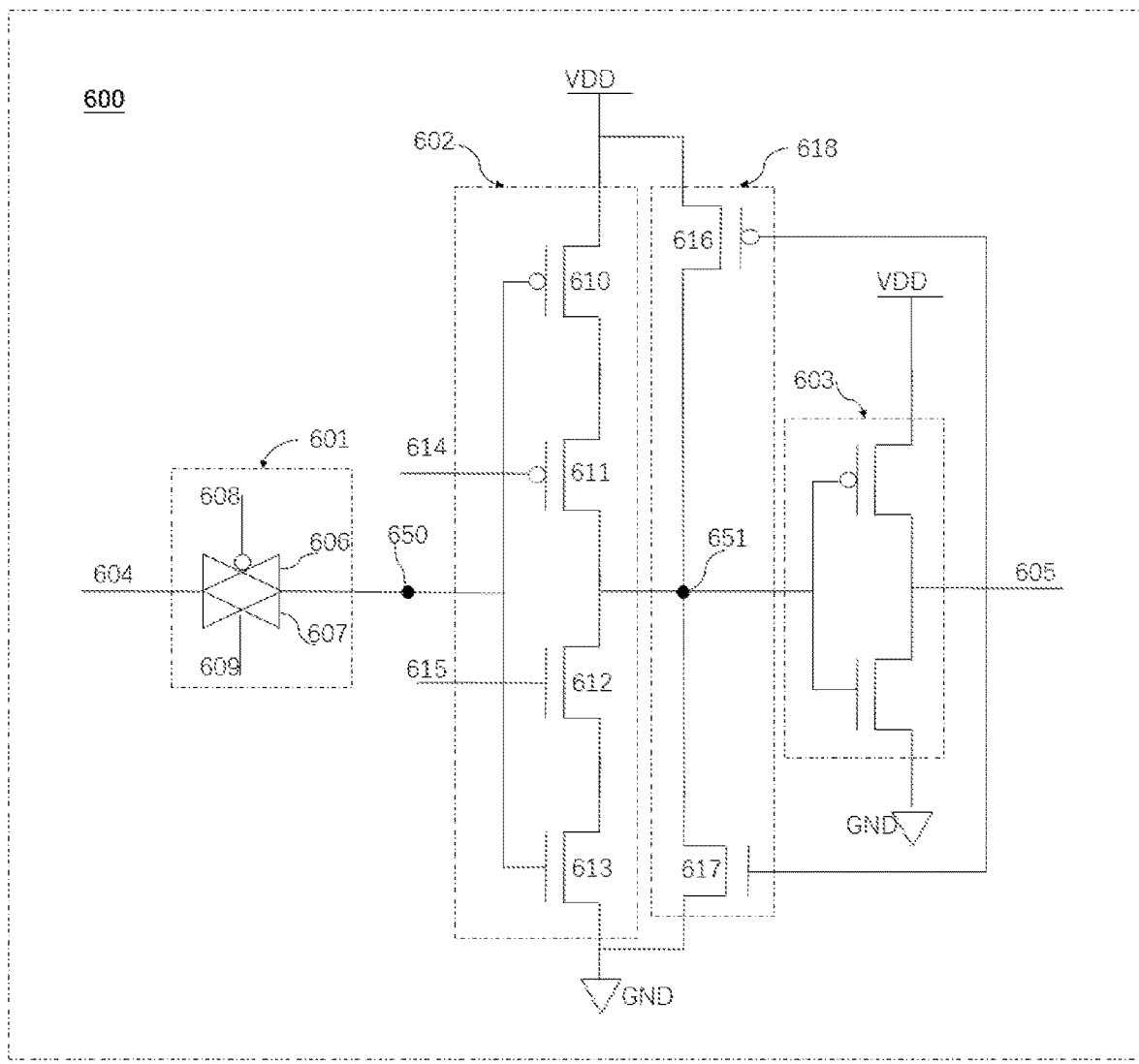
FIG. 4D is a circuit diagram of a variable embodiment of the dynamic D flip-flop of FIG. 4B.

FIG. 4D is a circuit diagram of a variable embodiment of the dynamic D flip-flop of FIG. 4B. Referring to FIG. 3, FIG.

4D differs from the embodiment of FIG. 4B in that the dynamic D flip-flop of FIG. 4D further comprises a positive feedback unit connected in parallel to both ends of the output driving unit 403. In this variable embodiment, the positive feedback unit is, such as, an inverter 618 consisting of a PMOS transistor 616 and a NMOS transistor 617, an input terminal of the inverter 618 is connected to an output terminal of the inverter 603, i.e., the output terminal 605 of the positive feedback dynamic D flip-flop 600, and an output terminal of the inverter 618 is connected to an input terminal of the inverter 603. When data at the second node 651 are "1", an output of the inverter 603 is "0", the PMOS transistor 616 is turned on to form a pull-up path to hold the data at the second node 651 to be "1". When the data at the second node 651 are "0", an output of the inverter 603 is "1", the NMOS transistor 617 is turned on to form a pull-down path to hold the data at the second node 651 to be "0". As can be seen, the inverters 618 and 603 form a data latch loop for better latching data of the output terminal 605 of the positive feedback dynamic D flip-flop at the second node 651. In addition, a feedback loop consisting of the PMOS transistor 616 and the NMOS transistor 617 shall have a worse current capacity than a normal reading and writing path, such that new data can be written correctly.

In addition, as for the dynamic D flip-flops shown in FIGS. 4A-4D, the clock signals CLKP and CLKN can be directly connected to the clock signals, and also can be supplied by a clock buffer. When the clock signals CLKP and CLKN are supplied by a clock buffer, the first latch units 401 of the dynamic D flip-flops, i.e., the transmission gates 501 and 601, are designed by a delay unit. Speed is reduced by using high threshold devices, electric leakage and transmission speed are reduced by using a small size, and transmission speed is slowed by using layout of parasitic resistor and capacitor, such that holding time of the dynamic D flip-flops can be reduced. Alternatively, the clock buffer of the dynamic D flip-flops is designed by a high speed unit, and comprises at least one cascaded clock buffer unit. Driving capability is strengthened by using low threshold voltage devices and increasing size of the devices. Driving balance between loads is balanced, and an overall driving speed is improved using the scheme of reasonably distributing clock delay, thereby reducing holding time of the dynamic D flip-flops.

It shall be noted that the dynamic D flip-flops shown in FIGS. 4A-4D also can be applied in multi-parallel connection. Each of the dynamic D flip-flops comprises an input terminal and an output terminal, and receives external clock signals through the clock buffer, and the clock signals CLKP and CLKN are supplied to each dynamic D flip-flop after the clock signals are buffered.

Hereinafter working principle of the dynamic D flip-flop according to the invention is explained in details.

Figure 5A:
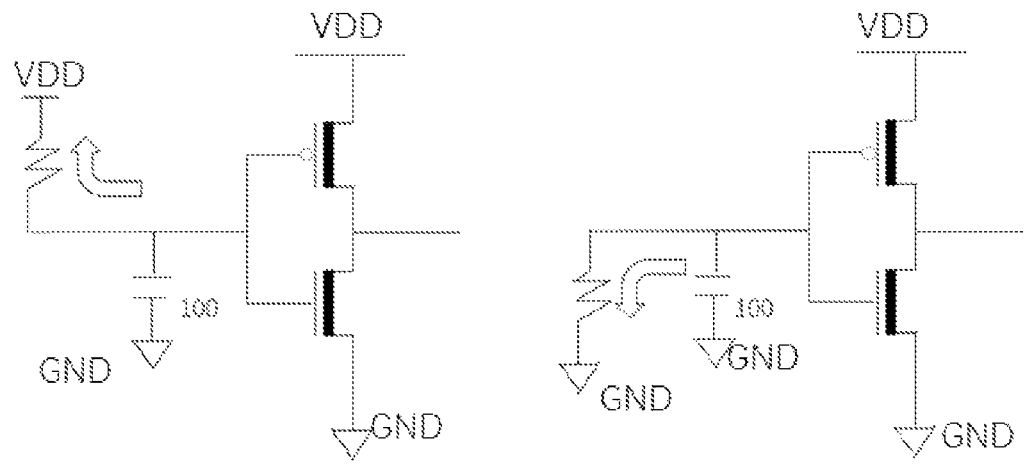
FIG. 5A is an equivalent circuit diagram when the dynamic D flip-flop of the invention writes data.
Figure 5B:
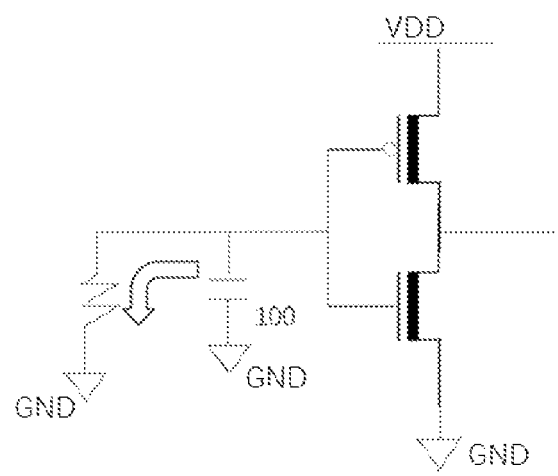
FIG. 5B is an equivalent circuit diagram when data of the dynamic D flip-flop of the invention are in a holding state.

FIG. 5A is an equivalent circuit diagram when the dynamic D flip-flop of the invention writes data, and FIG. 5B is an equivalent circuit diagram when data of the dynamic D flip-flop of the invention are in a holding state.

As shown in FIGS. 4A, 4B, 4C, 4D and 5A, when CLKP is a high level and CLKN is a low level, the transistors controlled by the clock in the three-state inverters 502 and 602 are turned on, and data transmitted from the transmission gates 501 and 601 are written into a parasitic capacitor 100. When input data are "0", the PMOS transistors 510, 511, 610 and 611 of the three-state inverters 502 and 602 are in a turn-on state to form pull-up paths to charge the parasitic capacitor 100, the second nodes 551 and 651 become a high level, and data are changed to "1". When input data are "1", the NMOS transistors 512, 513, 612 and 613 of the three-state inverters 502 and 602 are in a turn-on state to form pull-down paths to discharge the parasitic capacitor 100, the second nodes 551 and 651 become a low level, and data are changed to "0".

As shown in FIG. 5B, when the parasitic capacitor 100 is charged, if the three-state inverters 502 and 602 are in a high impedance state under control of the clock signals, the parasitic capacitor 100 is not further charged, and data at the second nodes 551 and 651 are in a holding state. On the other hand, due to influence of a leakage current of the NMOS transistors 512, 513, 612 and 613, electric charge on the parasitic capacitor 100 is gradually leaked, the high level on the second nodes 551 and 651 is inverted to a low level after a certain time length, and data registered in the parasitic capacitor 100 are changed from "1" to "0", finally causing data error.

Assuming that the electric charge produced on the parasitic capacitor 100 is Q, a capacitance of the parasitic capacitor 100 is C, and a voltage at both ends of a polar plate of the parasitic capacitor is V, $$Q=C*V.$$

If the leakage current is Ileakage, a leakage time t is:

$$t=Q/\text{Ileakage}=C*V/\text{Ileakage}.$$

In current production process, data stored in the parasitic capacitor 100 can be held for about 5 ns. In other words, if the data stored in the parasitic capacitor are updated periodically during data holding, the circumstance of data error won't occur. A working frequency of the current computing device is often above 500 MHz which far exceeds a desired data update frequency, such that the dynamic D flip-flop of the invention can be applied in the computing device, thereby reducing an error rate of an operation result of the computing device, and improving processing performance of a virtual currency operation device.

On the other hand, due to influence of leakage current, the electric charge stored on the parasitic capacitor 100 is gradually decreased, such that voltages at the second nodes 551 and 651 that shall be originally a high level are gradually reduced, and the voltages at the second nodes 551 and 651, serving as inputs of the inverters 503 and 603, cause the inverters 503 and 603 in a subthreshold turn-on state. The inverters 503 and 603 in the subthreshold turn-on state form a direct current discharge path directly from the power supply VDD to the ground GND, causing a sharp increase in power consumption.

Since the NMOS transistors 512, 513, 612 and 613 of the three-state inverters 502, 602 use the low leakage devices, and the inverters 503 and 603 use the high threshold voltage devices, the dynamic D flip-flops 500 and 600 of the invention can effectively reduce the leakage current on the NMOS transistors 512, 513, 612 and 613, and possibility of the inverters 503 and 603 working in a subthreshold interval, thereby reducing power consumption of the dynamic D flip-flops. The manners of low leakage devices and high threshold voltage devices can be used separately, and also can be used simultaneously.

In addition, as for the dynamic D flip-flops having the positive feedback unit, due to positive feedback function of the inverters 518 and 618, data stored on the parasitic capacitor 100 can be held normally till the data are rewritten by new data. Therefore, it is unnecessary to periodically update the data stored on the parasitic capacitor during data holding, and the circumstance of data error also won't occur.

Figure 6:
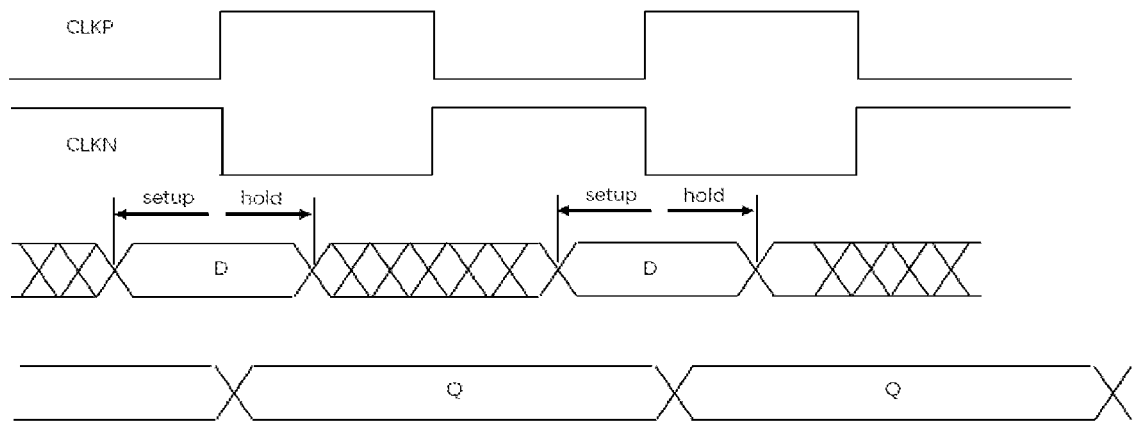
FIG. 6 is a timing diagram of the dynamic D flip-flop according to the invention.

FIG. 6 is a timing diagram of the dynamic D flip-flop according to the invention. As shown in FIG. 6, when CLKP is a low level, and CLKN is a high level, the first latch unit is turned on, such that data of an input terminal D pass through the first latch unit, and the second latch unit is turned off to hold an output of the dynamic D flip-flop in the original state. When a rising edge of CLKP comes, CLKP is jumped to a high level, and CLKN is jumped to a low level, the first latch unit is turned off to cut off data input of the input terminal D, and the second latch unit is turned on to output the held data of the input terminal D through an output terminal Q. As can be seen, when variation of states of the output terminal of the dynamic D flip-flop in the invention occurs as the rising edge of the clock signal CLKP comes, CLKP is a high level, and CLKN is a low level, and an output state is held unchanged.

Figure 7:
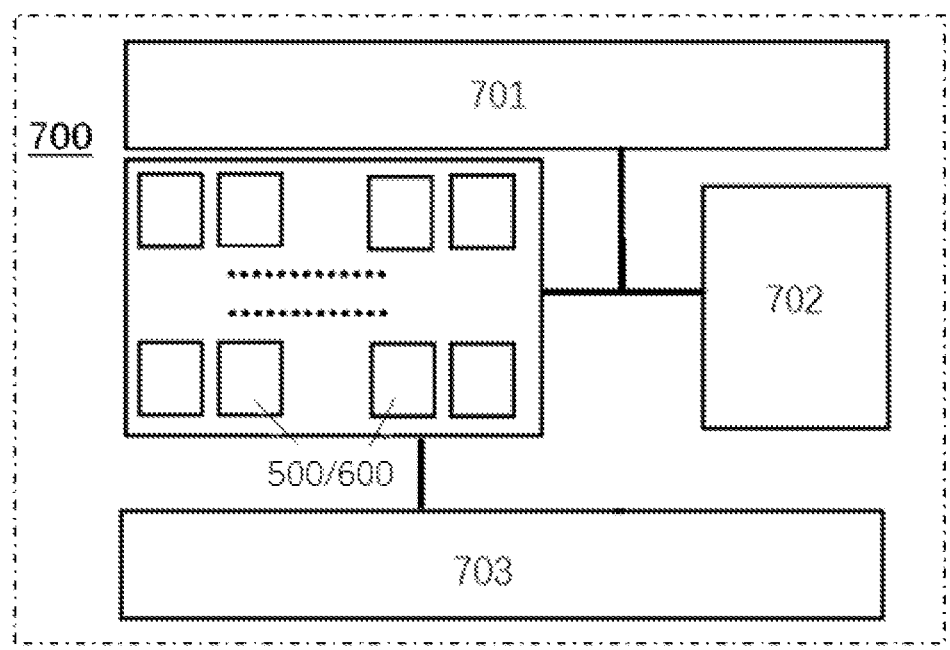
FIG. 7 is a schematic diagram of a data operation unit according to the invention.

The invention further provides a data operation unit, and FIG. 7 is a schematic diagram of a data operation unit according to the invention. As shown in FIG. 7, the data operation unit 700 comprises a control circuit 701, an operational circuit 702 and a plurality of dynamic D flip-flops 500, 600. The control circuit 701 refreshes data in the dynamic D flip-flops 500, 600, and reads data from the dynamic D flip-flops 500, 600. The operational circuit 702 performs operation on the read data, and then the operation result is outputted by the control circuit 701.

Figure 8:
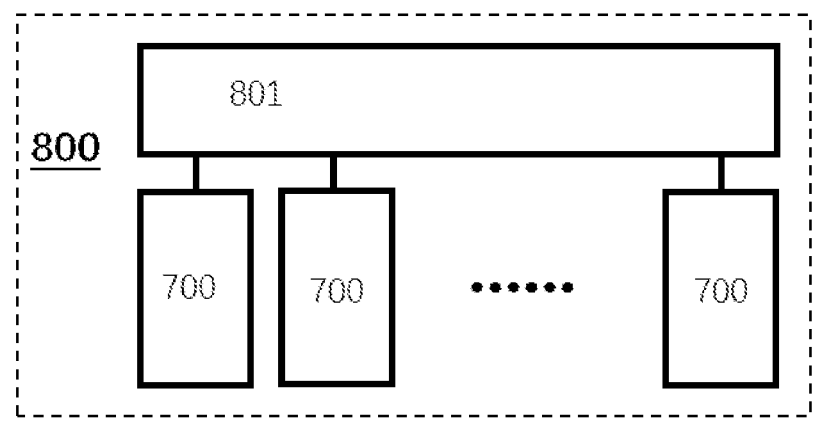
FIG. 8 is a schematic diagram of a chip according to the invention.

The invention further provides a chip, and FIG. 8 is a schematic diagram of a chip according to the invention. As shown in FIG. 8, the chip 800 comprises a control unit 801 and one or more data operation units 700. The control unit 801 inputs data into the data operation units 700, and processes data outputted from the data operation units 700.

Figure 9:
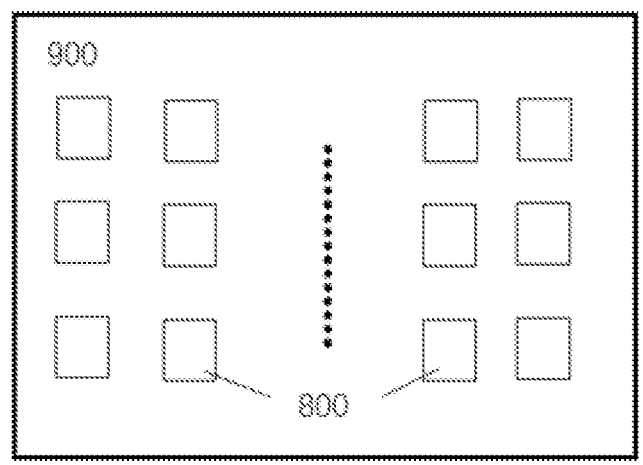
FIG. 9 is a schematic diagram of a hash board according to the invention.

The invention further provides a hash board, and FIG. 9 is a schematic diagram of a hash board according to the invention. As shown in FIG. 9, each of the hash boards 900 comprises one or more chips 800 to perform hash operation on working data sent downstream from a mining pool.

Figure 10:
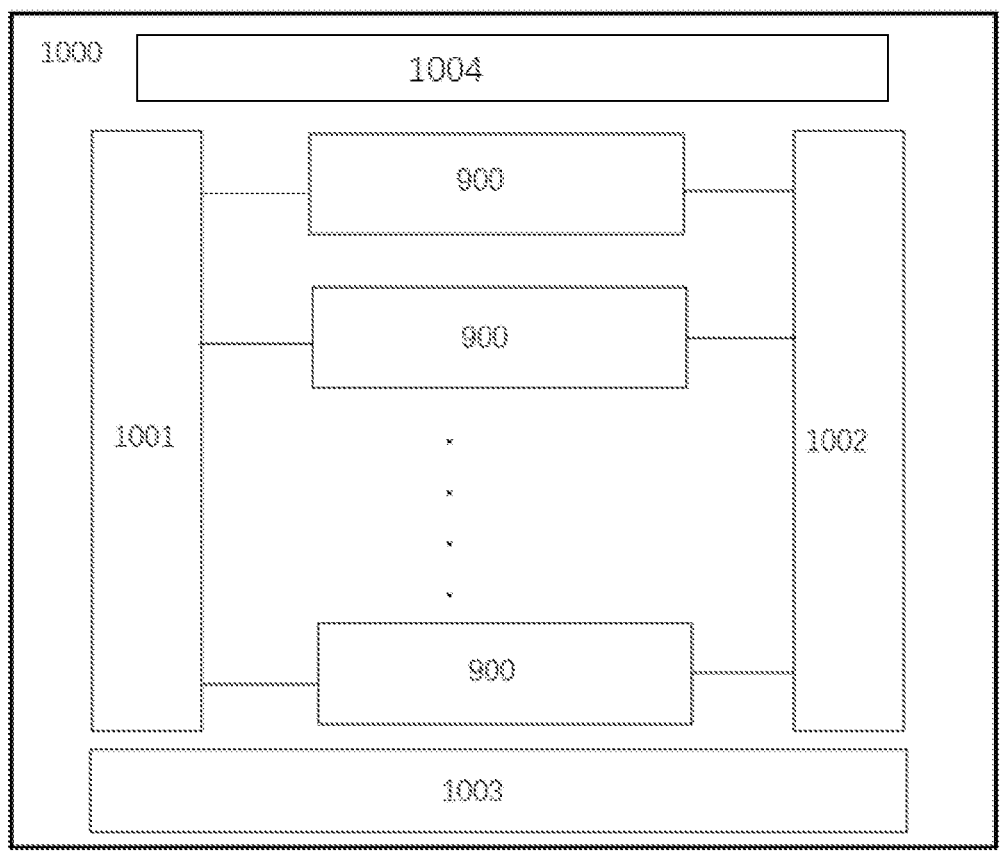
FIG. 10 is a schematic diagram of a computing device according to the invention.

The invention further provides a computing device, and the computing device is preferably configured to operation of mining virtual digital currency. Of course, the computing device also can be configured to any other massive operations, and FIG. 10 is a schematic diagram of a computing device according to the invention. As shown in FIG. 10, each of the computing devices 1000 comprises a connection board 1001, a control board 1002, a radiator 1003, a power supply plate 1004 and one or more hash boards 900. The control board 1002 is connected to the hash boards 900 through the connection board 1001, and the radiator 1003 is provided around the hash boards 900. The power supply plate 1004 is configured to supply a power supply to the connection board 1001, the control board 1002, the radiator 1003 and the hash boards 900.

It shall be noted that in the invention, orientation or positional relationship indicated by the terms "transverse", "longitudinal", "up", "down", "front", "back", "left", "right", "vertical", "horizontal", "top", "bottom", "in", "out", and the like is the orientation or positional relationship illustrated by the drawings, and is only for the purpose of describing the invention and simplifying the explanation, rather than indicating or suggesting that the referred device or element must have specific orientation, and be constructed and operated in specific orientation, so it shall not be understood as limits to the invention.

Although the embodiments of the invention have been disclosed above, they can be fully applied to various fields suitable for the invention but not as limits to those listed in the specification and the embodiments. For those skilled in the art, additional modifications can be easily implemented, so without departing from general concepts defined by the appended claims and equivalent scopes, the invention is not limited to specific details and figures illustrated and described here.

In other words, the invention also may have various other embodiments, and those skilled in the art shall make various corresponding modifications and variations according to the invention without departing from spirit and essence of the invention, but these corresponding modifications and variations shall belong to the scope protected by the appended claims of the invention.

INDUSTRIAL APPLICABILITY

Application of the dynamic D flip-flop, and a data operation unit, a chip, a hash board and a computing device using the same of the invention has the following advantageous effects:

can reduce approximately 30% of the chip area, power consumption and logic delay, thereby reducing production cost of the chip, and increasing product competitiveness. In terms of expanding, such dynamic D flip-flop can replace a D flip-flop in digital logic to simplify wiring process of the back-end layout, reduce design difficulty, and improve performance, thereby obtaining an advantage of area, and increasing practicability.

What is claimed is:

1. A dynamic D flip-flop, comprising:
an input terminal, an output terminal and at least one clock signal terminal;
a first latch unit for transmitting data of the input terminal and latching the data under control of a clock signal;
a second latch unit for latching data of the output terminal and inversely transmitting the data latched by the first latch unit under control of a clock signal; and
an output driving unit for inverting and outputting the data received from the second latch unit;
the first latch unit, the second latch unit and the output driving unit being sequentially connected in series between the input terminal and the output terminal;
wherein the second latch unit outputs in high level, low level and high impedance states by means of a single element under control of a clock signal.

2. The dynamic D flip-flop according to claim 1, wherein the second latch unit is a three-state inverter.

3. The dynamic D flip-flop according to claim 2, wherein the three-state inverter further comprises a first PMOS transistor, a second PMOS transistor, a first NMOS transistor and a second NMOS transistor sequentially connected in series between a power supply and ground.

4. The dynamic D flip-flop according to claim 3, wherein the first PMOS transistor and the second NMOS transistor perform switch control according to a clock signal, and the clock signals of the first PMOS transistor and the second NMOS transistor are inverted.

5. The dynamic D flip-flop according to claim 3, wherein the second PMOS transistor and the first NMOS transistor perform switch control according to a clock signal, and the clock signals of the second PMOS transistor and the first NMOS transistor are inverted.

6. The dynamic D flip-flop according to claim 1, wherein the second latch unit uses low leakage devices and/or the output driving unit uses high threshold voltage devices.

7. The dynamic D flip-flop according to claim 3, wherein the first NMOS transistor and the second NMOS transistor use low leakage current transistors.

8. The dynamic D flip-flop according to claim 1, further comprising a positive feedback unit for inverting data of the output terminal and feeding the data to the output driving unit.

9. The dynamic D flip-flop according to claim 8, wherein the positive feedback unit is an inverter connected in anti-parallel to both ends of the output driving unit.

10. The dynamic D flip-flop according to claim 1, wherein the first latch unit uses a delay unit.

11. The dynamic D flip-flop according to claim 10, wherein the clock signal terminal is connected with a clock buffer using low threshold units.

12. The dynamic D flip-flop according to claim 1, wherein a plurality of dynamic D flip-flops are connected in parallel.

13. A data operation unit, comprising a control circuit, an operational circuit and a plurality of dynamic D flip-flops interconnected with each other, the plurality of dynamic D flip-flops being connected in series and/or in parallel, wherein the plurality of dynamic D flip-flops are the dynamic D flip-flop according to claim 1.

14. A chip, comprising the data operation unit according to claim 13.

15. A hash board for a computing device, comprising the chip according to claim 14.

16. A computing device, comprising a power supply board, a control board, a connection board, a radiator and a plurality of hash boards, the control board connected to the hash boards through the connection board, the radiator provided around the hash boards, and the power supply board configured to supply a power supply for the connection board, the control board, the radiator and the hash boards, wherein the hash board is the hash board according to claim 15.

* * * * *